US011616344B2

(12) United States Patent
Vico Trivino et al.

(10) Patent No.: US 11,616,344 B2
(45) Date of Patent: Mar. 28, 2023

(54) FABRICATION OF SEMICONDUCTOR STRUCTURES

(71) Applicant: International Business Machines Corporation, Armonk, NY (US)

(72) Inventors: Noelia Vico Trivino, Zurich (CH); Kirsten Emilie Moselund, Rueschlikon (CH); Markus Scherrer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 16/865,973

(22) Filed: May 4, 2020

(65) Prior Publication Data
US 2021/0344173 A1 Nov. 4, 2021

(51) Int. Cl.
*H01S 5/32* (2006.01)
*H01S 5/02* (2006.01)
*H01L 21/205* (2006.01)
*H01L 21/02* (2006.01)
*H01L 21/306* (2006.01)

(52) U.S. Cl.
CPC .......... *H01S 5/32* (2013.01); *H01L 21/02164* (2013.01); *H01L 21/02647* (2013.01); *H01L 21/2056* (2013.01); *H01L 21/30604* (2013.01); *H01S 5/0217* (2013.01); *H01S 2304/04* (2013.01)

(58) Field of Classification Search
None
See application file for complete search history.

(56) References Cited

U.S. PATENT DOCUMENTS

| 7,883,914 | B2 | 2/2011 | Birkedal |
| 8,798,414 | B2 | 8/2014 | Quan |
| 8,829,638 | B2 | 9/2014 | Shambat |
| 2003/0221608 | A1* | 12/2003 | Mori ............... C30B 29/06 117/2 |
| 2010/0289043 | A1 | 11/2010 | Aurelien |
| 2015/0003775 | A1 | 1/2015 | Saado |

(Continued)

FOREIGN PATENT DOCUMENTS

| EP | 1369506 A1 | 12/2003 | |
| WO | WO-2017054037 A1 * | 4/2017 | ............ C30B 19/10 |

OTHER PUBLICATIONS

"Innovations for High Performance Microelectronics", IHP, 3 pages, Accessed on Apr. 24, 2020, <https://www.ihp-microelectronics.com/en/start.html>.

(Continued)

*Primary Examiner* — Alexander G Ghyka
(74) *Attorney, Agent, or Firm* — Edward J. Wixted, III

(57) ABSTRACT

The invention relates to a method for fabricating a semiconductor structure. The method comprises fabricating a photonic crystal structure of a first material, in particular a first semiconductor material and selectively removing the first material within a predefined part of the photonic crystal structure. The method further comprises replacing the first material within the predefined part of the photonic crystal structure with one or more second materials by selective epitaxy. The one or more second materials may be in particular semiconductor materials. The invention further relates to devices obtainable by such a method.

19 Claims, 8 Drawing Sheets

(56) References Cited

U.S. PATENT DOCUMENTS

2016/0153907 A1 6/2016 Silvano De Sousa
2019/0363514 A1 11/2019 Kim

OTHER PUBLICATIONS

Crosnier et al. "Hybrid indium phosphide-on-silicon nanolaser diode", Nature Photonics, Published Online: Apr. 17, 2017, vol. 11, May 2017, pp. 297-301, DOI: 10.1038/NPHOTON.2017.56.

Cutaia et al., "Complementary III-V heterojunction lateral NW Tunnel FET technology on Si", 2016 Symposium on VLSI Technology Digest of Technical Papers, 2 pages, doi:10.1109/VLSIT.2016.7573444.

Ellis et al. "Ultralow-threshold electrically pumped quantum-dot photonic-crystal nanocavity laser", Nature Photonics, Published Online: Apr. 24, 2011, 4 pages, DOI: 10.1038/NPHOTON.2011.51.

Heo et al., "@LNF: Monolithic Single GaN Nanowire Laser with Photonic Crystal Microcavity on Silicon", 4 pages, Accessed on Apr. 24, 2020, <https://lnf.umich.edu/monolithic-single-gan-nanowire-laser-with-photonic-crystal-microcavity-on-silicon>.

Jeong et al., "Electrically driven nanobeam laser", Nature Communications, Published Nov. 19, 2013, 6 pages, DOI: 10.1038/ncomms3822.

Kikitsuka et al., "Current-injection Photonic-crystal Laser", NTT Technical Review, 6 pages, Accessed on Apr. 24, 2020, <https://www.ntt-review.jp/archive/ntttechnical.php?contents=ntr201212fa10.html>.

Kim et al., "Photonic Crystal Cavity with a Thin Low-Index Layer for Silicon-Compatible Nanolight Source", MDPI, Applied Sciences, Received: Aug. 3, 2018; Accepted: Aug. 31, 2018; Published: Sep. 4, 2018, 8 pages, doi:10.3390/app8091552.

Kim et al., "Telecom-Wavelength Bottom-up Nanobeam Lasers on Silicon-on-Insulator", Nano Letters 17, 7 pp. 5244-5250 (2017), <https://doi.org/10.1021/acs.nanolett.7b01360>.

Matsuo et al., "High-speed ultracompact buried heterostructure photonic-crystal laser with 13 fJ of energy consumed per bit transmitted", Nature Photonics, Published Online: Aug. 1, 2010, 7 pages, DOI: 10.1038/NPHOTON.2010.177.

Matsuo, "Applications of photonic crystal and heterogeneous integration to ultra-low-energy lasers for optical interconnects and datacenter networks", ECOC 2016; 42nd European Conference on Optical Communication, Conference Paper, 3 pps.

Matsuo et al., "20-Gbit/s directly modulated photonic crystal nanocavity laser with ultra-low power consumption", Article in Optics Express, Jan. 2011, vol. 19, No. 3, 10 pps.

Matsuo et al., "Room-temperature continuous-wave operation of lateral current injection wavelength-scale embedded active-region photonic-crystal laser", Optics Express vol. 20, Issue 4, pp. 3773-3780 (2012).

Mukherjee, Ishita, "Hybrid Photonic Crystal Nanobeam Cavities: Design, Fabrication and Analysis", Bachelor of Technology, West Bengal University of Technology, 2010, A Thesis Submitted in Partial Fulfillment of the Requirements for the Degree of Master of Applied Science, 85 pages, Copyright Ishita Mukherjee, 2012.

Nozaki et al., "Femtofarad optoelectronic integration demonstrating energy-saving signal conversion and nonlinear functions", Nature Photonics, vol. 13, pp. 454-459 (2019).

Takiguchi et al., "Continuous-wave operation and 10-Gb/s direct modulation of InAsP/InP sub-wavelength nanowire laser on silicon photonic crystal", APL Photonics 2, 046106 (2017), Published Online: Apr. 3, 2017, 11 pages, <https://doi.org/10.1063/1.4977927>.

Thraskias et al., "Survey of Photonic and Plasmonic Interconnect Technologies for Intra-Datacenter and High-Performance Computing Communications", IEEE Communications Surveys Tutorials 20, 2758-2783 (2018).

Wang et al., "Polytypic InP Nanolaser Monolithically Integrated on (001) Silicon", Nano Letters 13, 5063-5069 (2013).

Wang, "IIIV microlasers epitaxially grown on silicon", Photonics Research Group, Ghent University, 3 pages, Accessed on Apr. 24, 2020, <https://photonics.intec.ugent.be/research/topics.asp?ID=191>.

Yao et al., "High-Q width modulated photonic crystal stack mode-gap cavity and its application to refractive index sensing", Optics Express, published Nov. 15, 2012, vol. 20, Issue 24, 6 pages, <https://doi.org/10.1364/OE.20.027039>.

"Patent Cooperation Treaty PCT Notification of Transmittal of the International Search Report and the Written Opinion of the International Searching Authority, or the Declaration", Applicant's or agent's file reference P201903953, International application No. PCT/IB2021/053243, International filing date Apr. 20, 2021, Priority Date May 4, 2020, 7 pages.

* cited by examiner

100

101

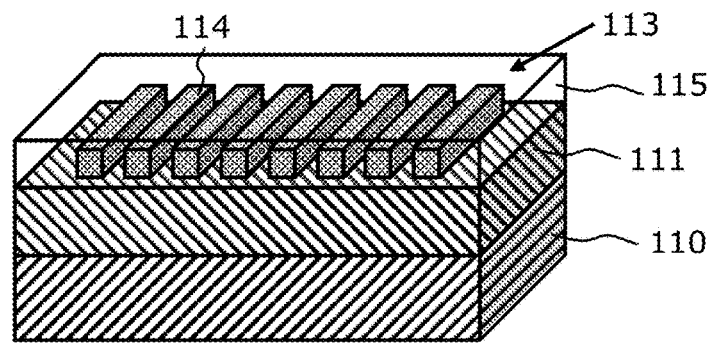
102
FIG. 1c
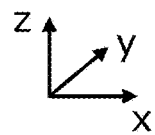
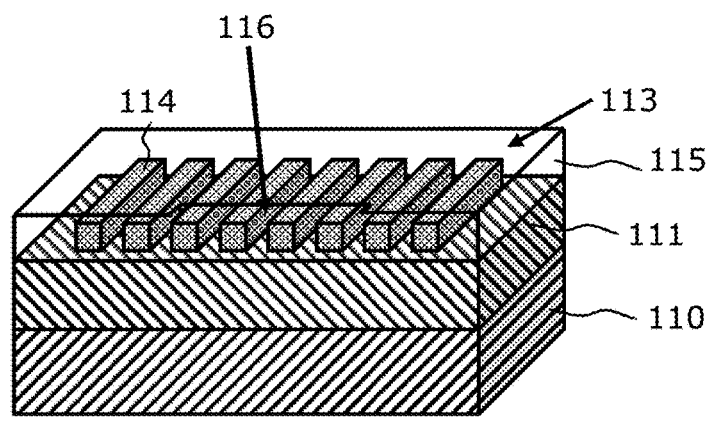
103
FIG. 1d
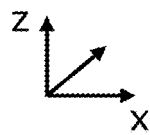

104

105

100

101

102

103

104

105

106

FABRICATION OF SEMICONDUCTOR STRUCTURES

BACKGROUND OF THE INVENTION

Embodiments of the invention relate generally to a method for fabricating semiconductor structures, in particular for optical applications such as laser applications. Embodiments of the invention further relate to semiconductor devices that may be fabricated with such a method, in particular a resonator or more specifically a laser.

Optical interconnects for next-generation computing require semiconductor light sources. Photonic crystal nanocavities are ideal platforms for such semiconductor light sources as they may provide strong light-matter interaction, high Q/V ratios, threshold-less laser behavior and high-speed modulation rates.

A challenge in photonic cavity-based devices is electrical actuation, i.e. to inject carriers efficiently to the active region without spoiling the optical cavity.

If the photonic cavity is implemented in the active material, excessive absorption losses may occur, because light is absorbed outside of the cavity.

On the other hand, a precise placement of the active material within the central part of the cavity remains a difficult challenge.

SUMMARY

According to a first aspect, the invention is embodied as a method for fabricating a semiconductor structure. The method comprises fabricating a photonic crystal structure of a first material, in particular a first semiconductor material, and selectively removing the first material within a predefined part of the photonic crystal structure. The method further comprises replacing the first material within the predefined part of the photonic crystal structure with one or more second materials by selective epitaxy. The one or more second materials may be in particular semiconductor materials.

Such methods according to embodiments of the invention provide an efficient way to fabricate photonic crystal structures comprising two different materials in an efficient manner.

According to embodiments, the properties of the first and second material may be improved or optimized independently to improve the efficiency of the device.

According to an embodiment, the predefined part of the photonic crystal structure is a central part of the photonic crystal structure. According to such an embodiment the second material can be placed in the central part of the photonic crystal structure. This may allow to confine the carriers effectively in the central part or the center of the photonic crystal structure, thereby improving the device performance.

While the first material may be in particular silicon, the second material may be in particular an optically active material. This may allow e.g. to use current photonic crystal cavity designs having a suitable or compatible geometry, in particular Si-photonic designs, and replace the silicon by the optically active material, e.g. by a group III-V material. Embodiments of the invention allow in particular to place the optically active material as gain material in the parts of the photonic crystal structure where it boosts the efficiency.

According to an embodiment, fabricating the photonic crystal structure comprises providing a wafer comprising a layer of the first material and patterning the layer of the first material, thereby fabricating the photonic crystal structure of the first material. This allows an efficient fabrication.

According to an embodiment, the wafer is a silicon-on-insulator wafer comprising a silicon layer on an insulating layer and the method further comprises patterning the silicon layer, thereby fabricating the photonic crystal structure comprising silicon as the first material. This allows an efficient fabrication.

According to an embodiment, replacing the first material with the one or more second materials comprises growing the one or more second materials in a lateral direction of the wafer. This allows advantageous device designs.

According to an embodiment, the method further comprises growing the one or more second materials with a predefined doping profile in the lateral direction of the wafer. This allows further advantageous device designs. In particular, methods according to embodiments of the invention may allow epitaxial in-plane lateral doping, i.e. the fabrication of p-i-n structures which are arranged parallel to the substrate of the wafer.

According to an embodiment, the method further comprises growing two different second materials in the lateral direction of the wafer, thereby forming a lateral heterojunction. According to such an embodiment, in a first step a first one of the second materials, e.g. a first III-V material such as AlGaAs or InP is epitaxially grown. And in second step, another one of the second materials, e.g. another III-V material such as InGaAs is epitaxially grown, thereby fabricating the lateral heterojunction.

According to an embodiment, the method further comprises providing electrical contacts to the one or more second materials. The provision of such electrical contacts may be facilitated according to embodiments in particular for the embodiments having lateral doping profiles.

According to embodiments, several different material combinations of the first material and a plurality of second materials may be implemented on the same wafer by repeating growth runs. This may be possible due to local integration of the gain material.

According to an embodiment, selectively removing the first material within the predefined part of the photonic crystal structure comprises encapsulating the photonic crystal structure of the first material with a third material, in particular with an oxide material. Further steps include selectively removing a part of the third material in the predefined part of the photonic crystal structure to provide a window to the first material and selectively removing a part of the first material through the window. This creates a template structure of the third material. The template structure may also be denoted as cavity structure. In order to facilitate a growth of the one or more second materials in the template structure, a remaining part of the first material forms a seed structure for the one or more second materials.

According to an embodiment, selectively removing the part of the first material through the window comprises performing a selective etching of the first material. In other words, the etching is performed such that only the first material is etched, but not the third material of the template structure.

According to an embodiment, replacing the first material with the one or more second materials comprises growing the one or more second materials within the template structure of the third material from the seed structure. This is an efficient and precise way to arrange the second material within the photonic crystal structure.

According to an embodiment, the method further comprises removing the seed structure of the first material after the growing of the one or more second materials within the template structure. This facilitates in particular the electrical contacting of the second material(s).

According to an embodiment, the growing of the one or more second materials is performed by one metal organic chemical vapor deposition (MOCVD), atmospheric pressure CVD, low or reduced pressure CVD, ultra-high vacuum CVD, molecular beam epitaxy (MBE), atomic layer deposition (ALD) or hydride vapor phase epitaxy.

According to an embodiment of a further aspect of the invention, a semiconductor device obtainable by a method according to the first aspect is provided.

According to an embodiment of a further aspect of the invention, a semiconductor device is provided which comprises a semiconductor substrate, an insulating layer on the semiconductor substrate and a photonic crystal structure on the insulating layer. The photonic crystal structure comprises a first material in an outer part and one or more second materials in a central part or area of the photonic crystal structure, wherein the one or more second materials are epitaxially grown semiconductor materials forming a gain structure which extends in a lateral direction of the substrate.

According to an embodiment, the photonic crystal structure is 1-dimensional, 2-dimensional or 3-dimensional photonic crystal lattice.

According to a further embodiment, the semiconductor device may be embodied as an optical resonator or laser. The gain structure may comprise according to embodiments one or more quantum wells.

The steps of the different aspects of the invention may be performed in different orders as appropriate. Furthermore, the steps may also be combined as appropriate, i.e. that e.g. two or more steps may be performed together.

Advantages of the features of one aspect of the invention may apply to corresponding features of another aspect of the invention.

Embodiments of the invention will be described in more detail below, by way of illustrative and non-limiting examples, with reference to the accompanying drawings.

BRIEF DESCRIPTION OF THE DRAWINGS

FIG. 1c shows a 3-dimensional view of a structure after encapsulating the photonic crystal structure with a third material, e.g. an oxide

FIG. 1d shows a 3-dimensional view of the structure after a window has been formed in the oxide and FIG. 2d shows a corresponding top view;

DETAILED DESCRIPTION

FIGS. 1a-1g show enlarged 3-dimensional views of initial, intermediate and final structures formed during the stages of fabrication methods according to embodiments of the invention. FIGS. 2a-2g show corresponding enlarged top views of the structures corresponding to the FIGS. 1a-1g.

In any or all of the figures the dimensions may not be drawn to scale and may be shown in a simplified and schematic way to illustrate the features and principles of embodiments of the invention.

The term "on" and "above" are used in this context, as is customary, to indicate orientation or relative position in a vertical or orthogonal direction to the surface of the substrate, in particular in a vertical z-direction.

The terms "lateral" or "laterally" are used in this context, as is customary, to indicate orientation generally parallel to the plane of the substrate, as opposed to generally vertically, or outwardly, from the substrate surface.

The term "arranged on the semiconductor substrate" shall be understood in a broad sense and shall include in particular embodiments according to which an intermediate layer, e.g. an insulating layer, is arranged between the substrate and the photonic crystal structure. Hence the term "arranged on the substrate" shall include the meaning arranged "above the substrate".

Figure 1A:
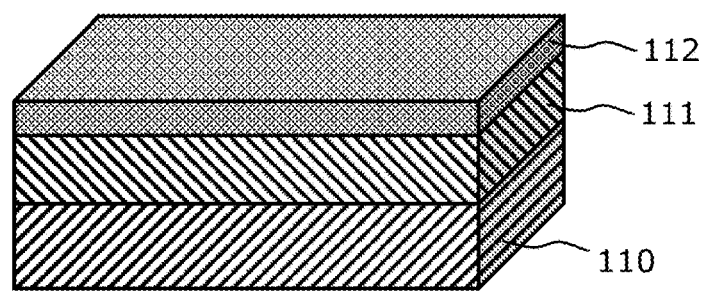
FIG. 1a shows a 3-dimensional view of an initial structure comprising a layer of a first material and FIG. 2a shows a corresponding top view.
Figure 1A:
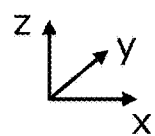
Figure 2A:
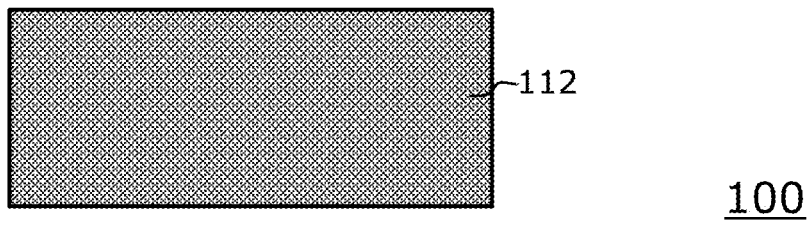

FIG. 1a illustrates a 3-dimensional view of an initial structure 100 and FIG. 2a a corresponding top view. The initial structure 100 comprises a substrate 110. The substrate 110, illustrated by diagonal upward stripes, comprises a semiconductor material and may be e.g. a bulk semiconductor substrate. The substrate 110 may be embodied as a crystalline semiconductor or a compound semiconductor wafer of a large diameter. The substrate may comprise, for example, a material from group IV of the periodic table as semiconductor material. Materials of group IV include, for example, silicon, germanium, mixed silicon and germanium, mixed silicon and carbon, mixed silicon germanium and carbon and the like. For example, the substrate 110 may be a crystalline silicon wafer that is used in the semiconductor industry.

The structure 100 further comprises an insulating layer 111 on the substrate 110, illustrated by diagonal downward stripes. The insulating layer 111 may be embodied e.g. as a dielectric layer. The insulating layer 111 can be formed by known methods, as for example thermal oxidation, chemical vapor deposition (CVD), plasma enhanced CVD (PECVD), atomic layer deposition, chemical solution deposition, MOCVD, evaporation, sputtering and other deposition processes. Examples of such dielectric material include, but are not limited to: $SiO_2$, $Si_3N_4$, $Al_2O_3$, AlON, $Ta_2O_5$, $TiO_2$, $La_2O_3$, $SrTiO_3$, $LaAlO_3$, $ZrO_2$, $Y_2O_3$, $Gd_2O_3$, MgO, MgNO, Hf-based materials and combinations including multilayers thereof.

The structure 100 further comprises a layer 112 of a first material embodied as semiconductor material on the insulating layer 111. The first material may be in particular silicon. The layer 112 of the first material is illustrated with a dotted pattern of 30%.

The thicknesses of the substrate 110, the insulating layer 111 and the layer 112 can be any suitable thicknesses.

The structure 100 may be in particular embodied as a silicon-on-insulator wafer.

Figure 1B:
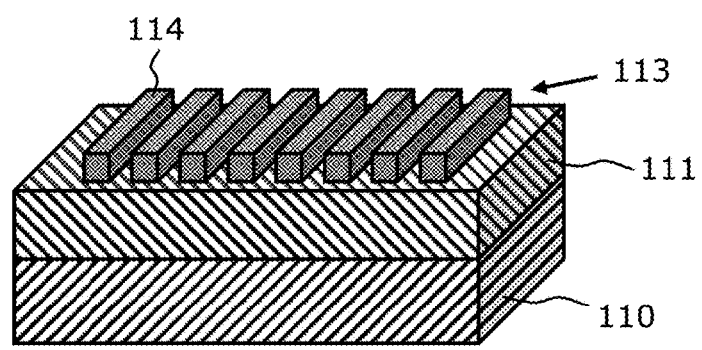
FIG. 1b shows a 3-dimensional view comprising a photonic crystal structure that has been formed from the layer of the first material by patterning and FIG. 2b shows a corresponding top view.
Figure 1B:
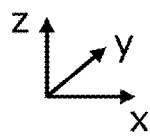
Figure 1E:
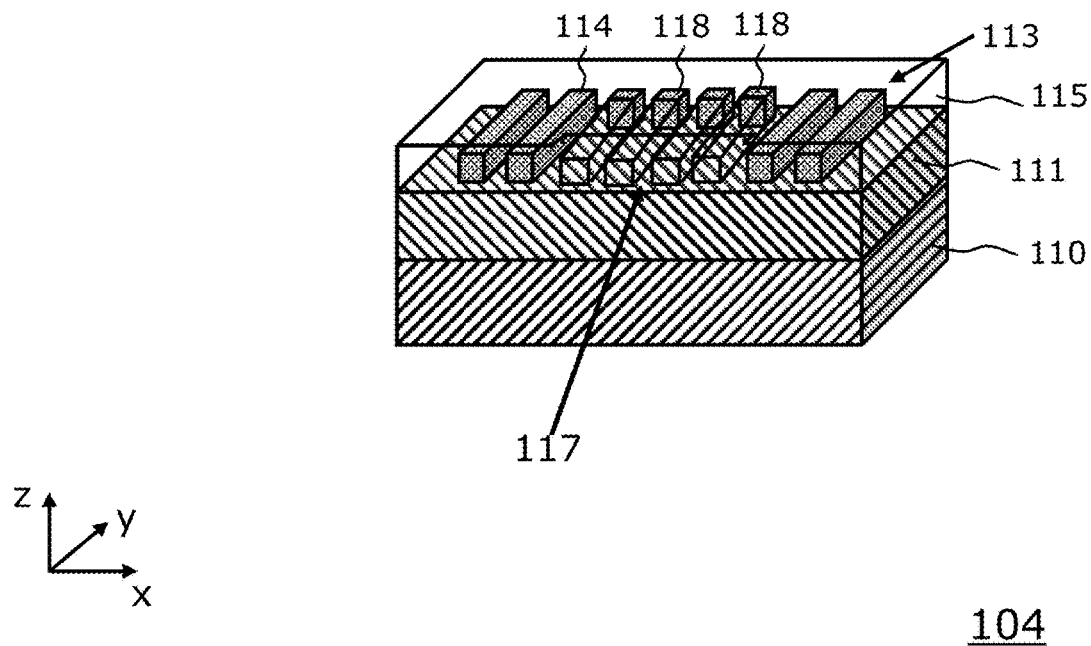
FIG. 1e shows a 3-dimensional view of the structure after a part of the first material has been selectively removed through the window and FIG. 2e shows a corresponding top view.
Figure 1F:
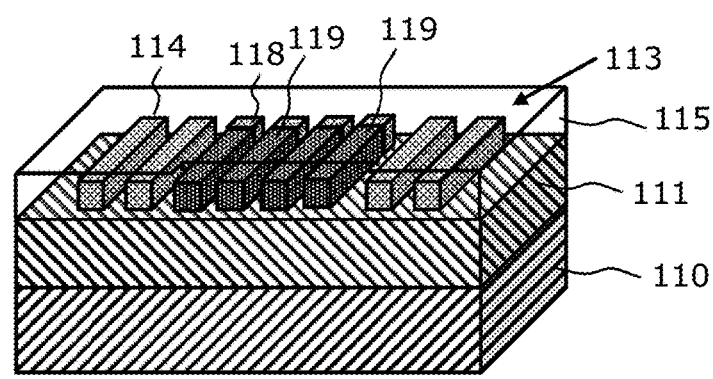
FIG. 1f shows a 3-dimensional view after a second material has been grown from a seed structure of the first material and FIG. 2f shows a corresponding top view.
Figure 1G:
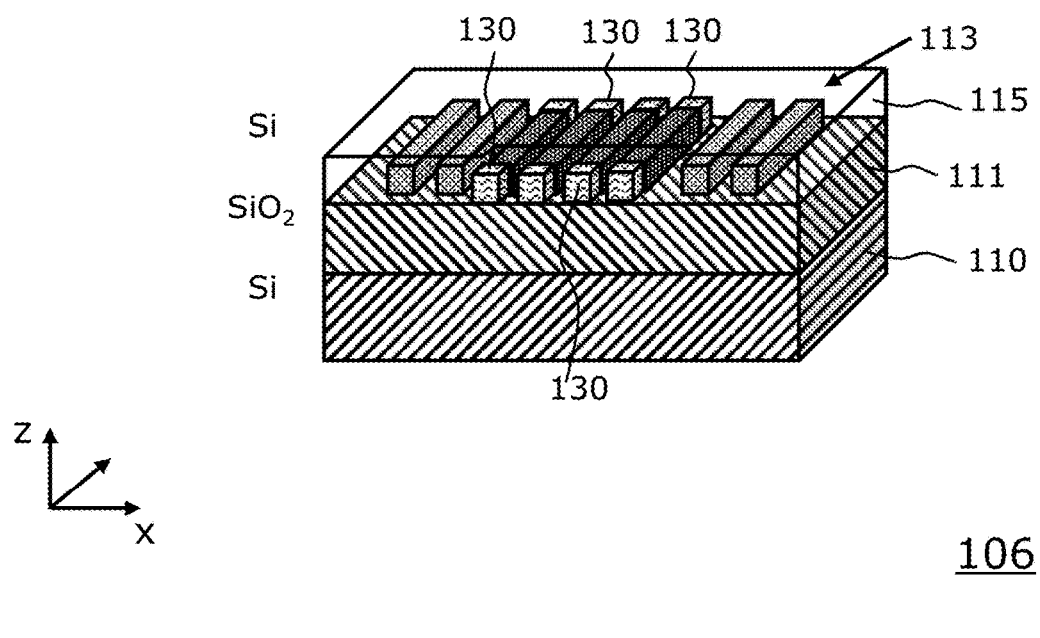
FIG. 1g shows a 3-dimensional view of the structure after the second material has been electrically contacted and FIG. 2g a corresponding top view.
Figure 2B:
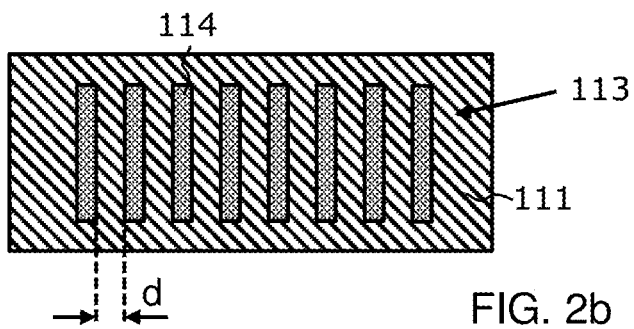
Figure 2C:
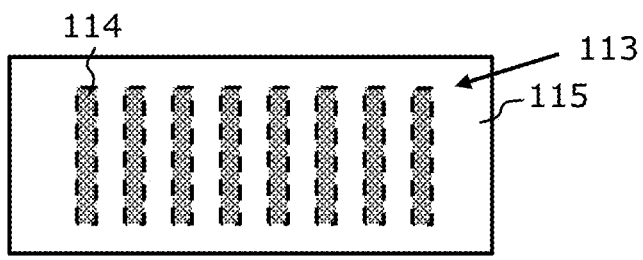
FIG. 2c shows a corresponding top view.

FIG. 1b illustrates a 3-dimensional view of a structure 101 and FIG. 2b a corresponding top view. The structure 101 comprises a photonic crystal structure 113 of the first material, e.g. of silicon. The structure 101 has been formed by patterning the layer 112 of the first material. This may be performed e.g. by lithography and subsequent etching. According to an embodiment, the patterning of the layer 112 may be performed by an etching based on HBr chemistry. The photonic crystal structure 113 comprises a plurality of rods 114 of the first material. The rods 114 are serially arranged next to each other with a predefined regular distance d. The rods extend in a lateral direction of the substrate 110, more particularly parallel to the x-y-plane of the substrate 110. FIG. 1c illustrates a 3-dimensional view of a structure 102 and FIG. 2c a corresponding top view. The structure 102 comprises an encapsulation layer 115 which has encapsulated the photonic crystal structure 113 of the first material. The encapsulation layer 115 comprises a third material, in particular a dielectric material, in particular an oxide. The encapsulation layer 115 will be used as template structure as will be described further below. The encapsulation layer 115 completely covers the rods 114. For ease of illustration, the encapsulation layer 115 is shown in a transparent manner in the FIGS. 1c to 1h.

Figure 2D:
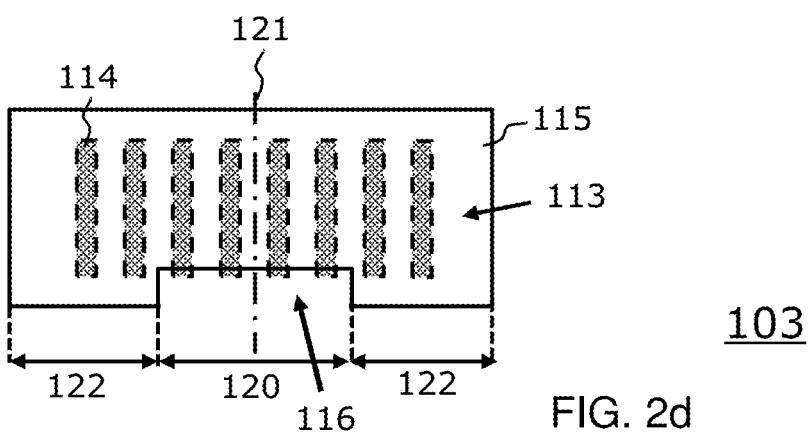

FIG. 1d illustrates a 3-dimensional view of a structure 103 and FIG. 2d a corresponding top view. The structure 103 comprises a window 116 which has been formed by selectively removing a part of the third material of the encapsulation layer 115 in a predefined part 120, shown in FIG. 2d, of the photonic crystal structure 113. The window 116 establishes a window to the first material of the photonic crystal structure 113. In other words, the window 116 provides an opening to the photonic crystal structure 113 within the predefined part 120. The predefined part 120 is arranged in a central part of the photonic crystal structure 113. More particularly, the predefined part 120 is arranged symmetrically to a symmetry axis 121, shown in FIG. 2d, of the photonic crystal structure. The window 116 may be fabricated e.g. by lithography and etching. The central part 120 of the photonic crystal structure is surrounded by or enclosed by outer parts 122, shown in FIG. 2d, of the photonic crystal structure 113.

It should be noted that the rods 114 may generally have any desired shape and geometry as suitable for the respective application. The rods 114 may also be denoted as bars. According to embodiments, the geometry of the rods 114 in the outer parts 122 may be different from the geometry of the rods 114 in the central part 120. As an example, the rods 114 in the outer parts 122 may have a different length and width than the rods 114 in the central part 120.

Figure 2E:
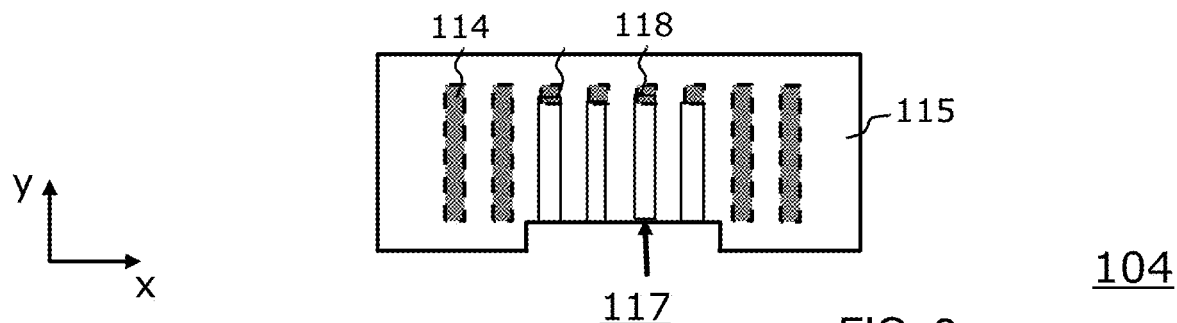

FIG. 1e illustrates a 3-dimensional view of a structure 104 and FIG. 2e a corresponding top view. In the structure 104, a part of the first material of the rods 114 in the central part 120 has been removed through the window 116. The rods 114 have created a hollow cavity or template structure 117 within the third material. However, the rods 114 have not been removed completely, but a remaining part of the rods 114 form a seed structure 118 for a subsequent growth of one or more second materials in the template structure 117. The selective removal of the first material through the window 116 may be performed by a selective etching of the first material, i.e. an etching that etches the first material, but not the third material. The suitable etching technique may depend on the respective first and third material. In general, the etching technique is chosen to be such that it only etches the first material, but not the third material of the encapsulation layer. The selective removal may be performed in particular by a dry or wet etching of the first material.

Figure 2F:
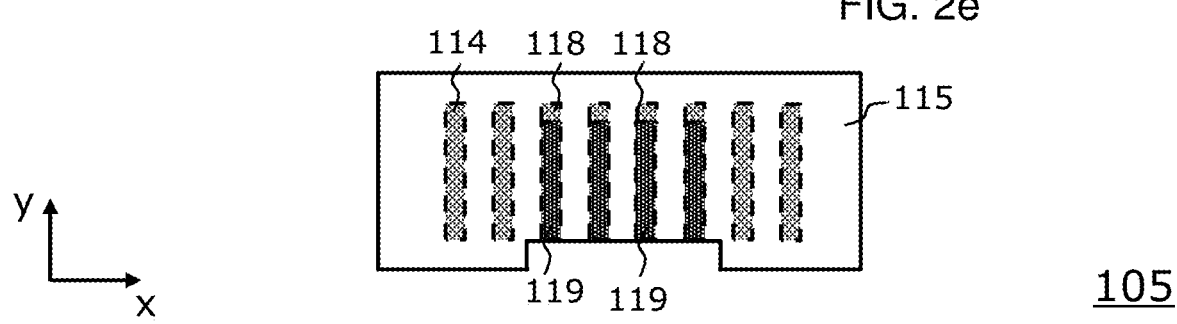

FIG. 1f illustrates a 3-dimensional view of a structure 105 and FIG. 2f a corresponding top view. In the structure 105, the removed first material has been replaced within the predefined part 120 of the photonic crystal structure 113 with one or more second materials by selective epitaxy. More particularly, the one or more second materials have been grown within the template structure 117 of the third material from the seed structure 118. The growing of the one or more second materials has been performed in a lateral direction of the substrate 110. The one or more second materials form rods 119 of the second material that have replaced the former rods 114 of the first material within the central part 120 of the photonic crystal structure 113. The rods 119 of the second material are illustrated with a dotted pattern of 70%.

The growing of the rods 119 of the second materials may be performed e.g. by metal organic chemical vapor deposition (MOCVD), atmospheric pressure CVD, low or reduced pressure CVD, ultra-high vacuum CVD, molecular beam epitaxy (MBE), atomic layer deposition (ALD) or hydride vapor phase epitaxy.

The second materials of the rods 119 may be in particular optically active materials. The second materials may be e.g. InP, InGaAs, AlGaAs, GaAs, GaN, InGaN, AlGaN, any other ternary or quaternary alloys thereof, group II-VI semiconductors or group IV semiconductors.

In general, the versatility of methods according to embodiments of the invention may allow any combination of group III-V semiconductor materials in the template structure 117, including embedded quantum wells, quantum dots, quantum wires, doped or intrinsic semiconductor layers as well as heterojunctions.

Figure 2G:
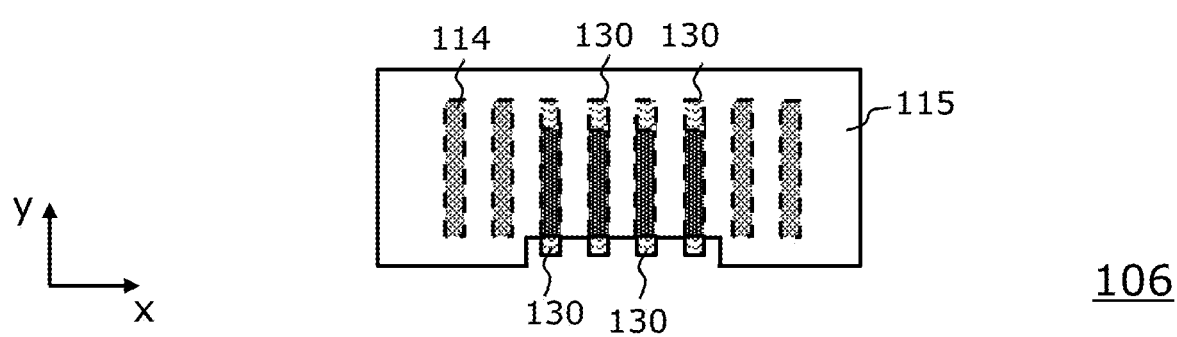

FIG. 1g illustrates a 3-dimensional view of a structure 107 and FIG. 2g a corresponding top view. In the structure 106, electrical contacts 130 have been provided which contact the one or more second materials of the rods 119. The rods 119 are illustrated with a wave pattern.

According to further embodiments, depending on the respective application and post processing, there may be an additional step of removing the seed structure 118 of the first material before the step of providing the electrical contacts.

The rods 114 (as mentioned above) and accordingly the rods 119 may generally have any desired shape and geometry as suitable for the respective application. Hence according to embodiments, the geometry of the structure of the first material and the geometry of the structure of the second material may be different. As an example, the rods 119 of the second material may have a different length and width than the rods 114 of the first material.

Figure 3:
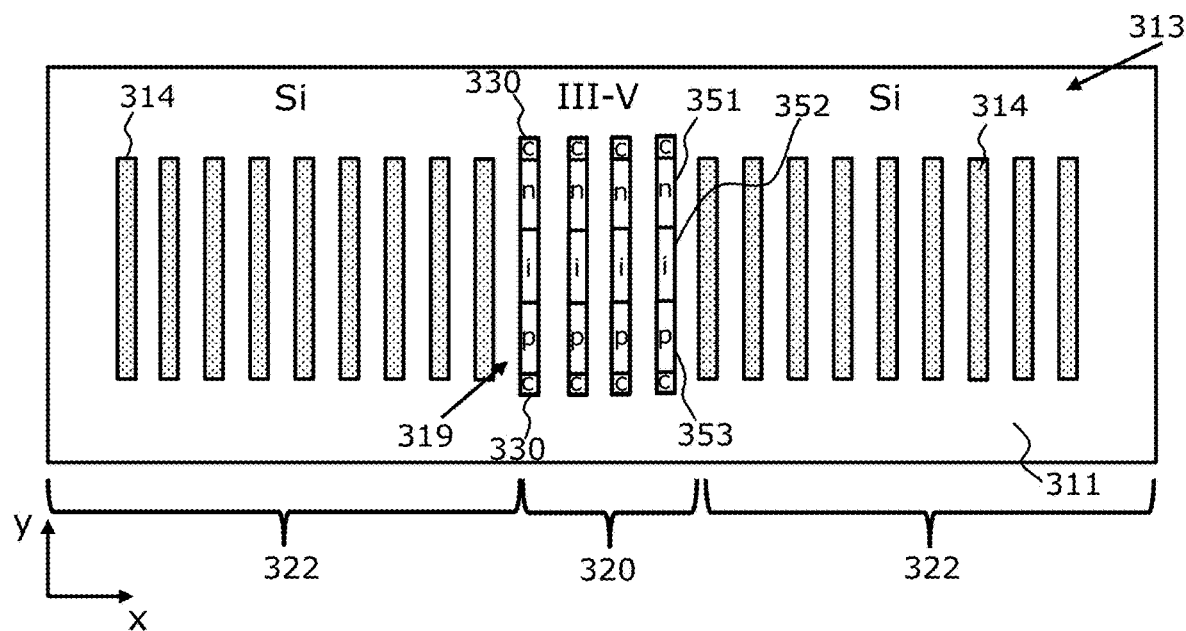
FIG. 3 shows an exemplary top view of a semiconductor device according to an embodiment of the invention.

FIG. 3 shows an exemplary top view of a semiconductor device 300 according to an embodiment of the invention. It comprises a photonic crystal structure 313 which is arranged on an insulating layer 311 of e.g. an SOI-wafer. The semiconductor device 300 may be fabricated with methods according to embodiments of the invention as explained above.

The photonic crystal structure 313 comprises a plurality of rods 314 of Si which are arranged in outer areas 322 of the photonic crystal structure 313 and a plurality of rods 319 of one or more second materials, in particular group III-V materials, in a central area 320 of the photonic crystal structure 313.

The plurality of rods 319 in the central area 320 form a gain structure. The rods 319 are embodied as p-i-n structures. The rods 319 have been epitaxially grown and extend in a lateral direction of the substrate and the photonic crystal structure, more particularly in an y-direction of an x-y-plane. The x-y-plane is arranged in parallel to an underlying substrate (not shown in FIG. 3). Accordingly, the rods 319 have an exemplary p-i-n doping profile. The rods 319 are contacted laterally by electrical contacts 330, which are also denoted by "c" in FIG. 3. The photonic crystal structure 313 is embodied as 1-dimensional photonic crystal lattice and establishes a photonic mirror with a gain structure in the central part or in other words central area 320.

Hence the embodied gain structure may include a doping profile which forms a p-i-n-structure. This may facilitate electrical pumping. A p-i-n-structure is a structure having an intrinsic region arranged between a p-doped region and a n-doped region.

In this respect, doping shall be understood as the intentional introduction of impurities into an intrinsic semiconductor for the purpose of modulating its electrical and optical and structural properties. Doping a semiconductor introduces allowed energy states within the band gap, but very close to the energy band that corresponds to the dopant type. Positive or p-type doping introduces free holes in the valence band, whereas negative or n-type doping introduces free electrons within the conduction band.

The introduction of dopants has the effect of shifting the energy bands relative to the Fermi level. In an n-type semiconductor the Fermi level is close to the conductance band, or within the conductance band in a degenerate n-type semiconductor. For p-type the Fermi level is close to the or within the Valance band. Doping densities in typically doped semiconductors range from $5 \times 10^{18}$ cm$^{-3}$ to $10^{20}$ cm$^{-3}$, depending on the material and density of states. Whereas semiconductors are rarely perfectly intrinsic, intrinsic in the electrical sense means that they are not conductive. Typically, the doping level is around $10^{15}$-$10^{16}$ cm$^{-3}$.

The p-i-n structure may be grown in the template structure formed by the encapsulating oxide as follows:

In a first sub-step a n-doped semiconductor layer 351 of the second semiconductor material has been grown in the template structure. In a second sub-step, an intrinsic layer 352 of the second semiconductor material has been grown. And in a third sub-step a p-doped semiconductor layer 353 of the second semiconductor material has been grown. The semiconductor layers 351, 352 and 353 collectively form the gain structure of the photonic crystal structure 313.

According to other embodiments a plurality of quantum wells, may be grown in the central part of the photonic crystal structure by growing sequentially in the template structure in an alternating way a plurality of semiconductor layers of different semiconductor materials. The different semiconductor materials may have a different bandgap to facilitate the formation of the quantum wells.

Figure 4:
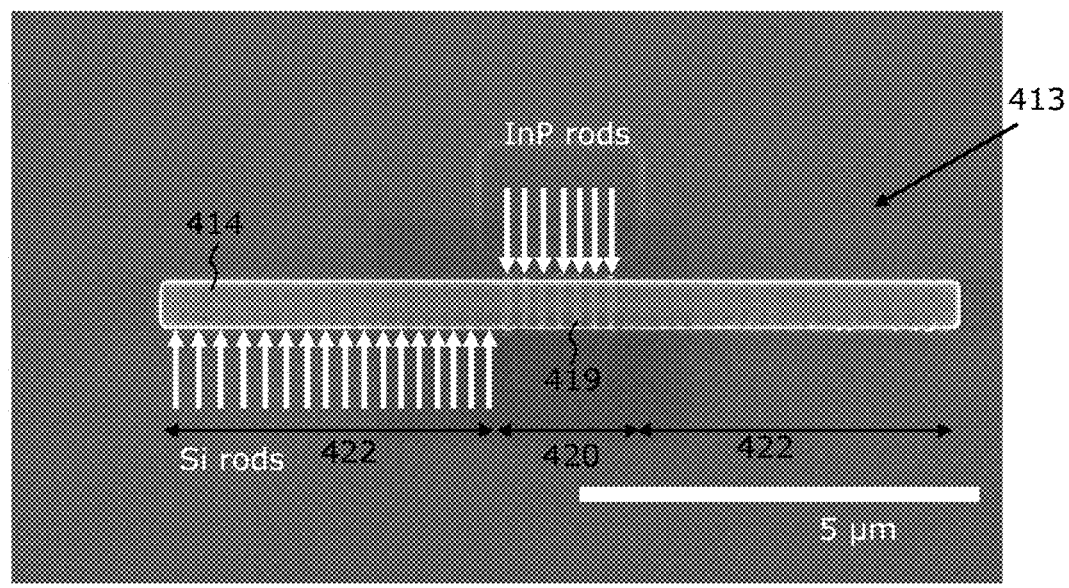
FIG. 4 is a scanning electron microscope image showing an exemplary device structure which has been fabricated with a method according to an embodiment of the invention.

FIG. 4 is a scanning electron microscope image showing an exemplary device structure 400 which has been fabricated with a method according to an embodiment of the invention. The device structure 400 comprises a photonic crystal structure 413 encompassing a plurality of Si-rods 414 in outer areas 422 of the photonic crystal structure 413 and a plurality of InP-rods 419 in a central area 420 of the photonic crystal structure 413. The plurality of InP-rods 419 have been fabricated by replacing Si-rods in the central area 420 of the photonic crystal structure 413.

As an oxide-layer is covering the photonic crystal structure 413, the rods 414 and 419 can only be seen in a shadowed way.

Figure 5:
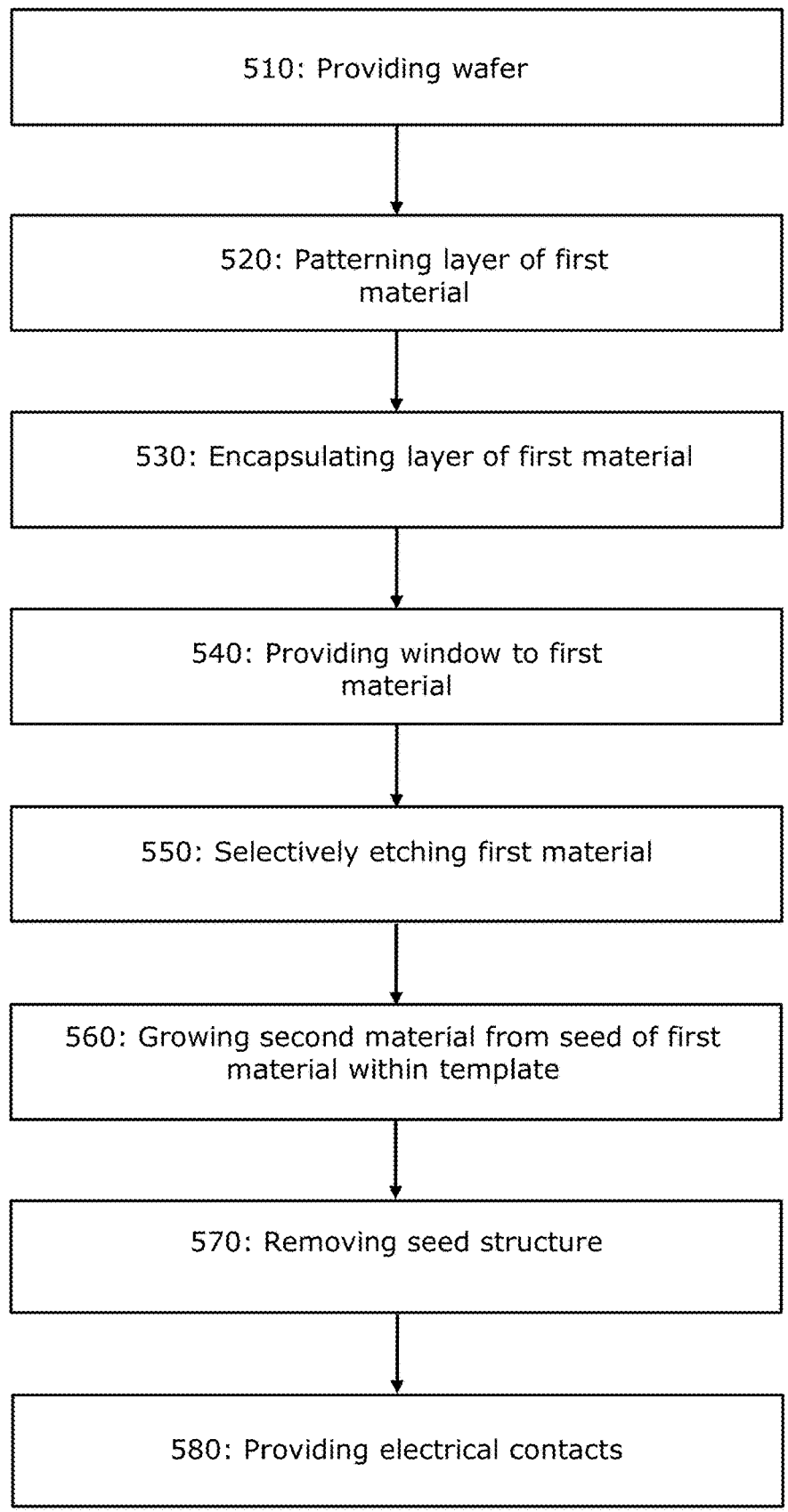
FIG. 5 shows a flow chart of method steps of a method for fabricating a semiconductor structure according to embodiments of the invention.

FIG. 5 shows a flow chart of method steps of a method for fabricating a semiconductor structure according to embodiments of the invention.

At a step 510, a wafer comprising a layer of the first material, in particular a silicon-on-insulator wafer, is provided.

At a step 520, the layer of the first material is patterned, e.g. by lithography and etching, thereby forming a photonic crystal structure.

At a step 530, the photonic crystal structure of the first material is encapsulated with a third material, in particular an oxide.

At a step 540, a part of the third material is selectively removed in the central part of the photonic crystal structure. This provides a window or in other words an opening through the oxide to the first material.

At a step 550, the first material is partly and selectively removed through the window within the central part or in other words central area of the photonic crystal structure. This creates a hollow template structure or cavity structure of the third material. However, the first material is not removed completely, but performed such that a part of the first material remains in the template structure and provides a seed structure for a subsequent growth of the one or more second materials.

At a step 560, the one or more second materials are grown from the seed of the first material within the template structure by selective epitaxy. As a result, the first material has been replaced within the central part of the photonic crystal structure with one or more of the second materials.

At a step 570, the seed structure of the first material may be removed, e.g. by etching. Whether this step is useful depends on the respective design of the semiconductor structure and the respective post-processing.

At a step 580, electrical contacts are provided to the structure of the second materials that has been formed within the template structure of the third material.

It should be noted that the step 580 may be followed by further processing steps as appropriate to derive at a final device structure as desired.

While illustrative examples are given above, it will be appreciated that the basic fabrication steps described above can be used to produce semiconductor structures of other materials, shapes and sizes. Materials and processing techniques can be selected as appropriate for a given embodiment, and suitable choices will be readily apparent to those skilled in the art.

While particular examples have been described above, numerous other embodiments can be envisaged. The seed surfaces for growing the semiconductor structures may be preferably crystalline seed surfaces, but may according to other embodiments also be provided by amorphous surfaces. If the seed has a well-defined crystalline orientation and if the crystal structure of the seed is a reasonable match to that of the growing crystal (for example a III-V compound semiconductor), the growing crystal can adapt this orientation. If the seed is amorphous or has an undefined crystal orientation, the growing crystal will be single crystalline, but its crystal orientation will be random.

The disclosed semiconductor structures and circuits can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip may be integrated with other chips, discrete circuit elements, and/or other signal processing devices as part of either an intermediate product, such as a motherboard, or an end product. The end product can be any product that includes integrated circuit chips.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the term "quantum well" is a non-limiting term and not intended to refer to only quantum well embodiments, but may encompass all possible quantum emitting systems like quantum dots and quantum wires.

As used herein, the terms "invention" or "present invention" are non-limiting terms and not intended to refer to any single aspect of the particular invention but encompass all possible aspects as described in the specification and the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor structure, the method comprising:
   fabricating a photonic crystal structure of a first material;
   encapsulating the photonic crystal structure of the first material with a third material;
   selectively removing a part of the third material in a predefined part of the photonic crystal structure to provide a window to the first material;
   selectively removing the first material within the predefined part of the photonic crystal structure; and
   replacing the first material within the predefined part of the photonic crystal structure with one or more second materials by selective epitaxy.

2. The method as claimed in claim 1, wherein the predefined part of the photonic crystal structure is a central part of the photonic crystal structure.

3. The method as claimed in claim 1, wherein fabricating the photonic crystal structure comprises:
   providing a wafer comprising a layer of the first material; and
   patterning the layer of the first material, thereby fabricating the photonic crystal structure of the first material.

4. The method as claimed in claim 3, wherein the wafer is a silicon-on-insulator wafer comprising a silicon layer on an insulating layer.

5. The method as claimed in claim 3, wherein replacing the first material with the one or more second materials comprises growing the one or more second materials in a lateral direction of the wafer.

6. The method as claimed in claim 5, further comprising growing the one or more second materials with a predefined doping profile in the lateral direction of the wafer.

7. The method as claimed in claim 5, further comprising growing two different second materials in the lateral direction of the wafer, thereby forming one or more lateral heterojunction.

8. The method as claimed in claim 1, wherein selectively removing the predefined part of the first material through the window comprises performing a selective etching of the first material.

9. The method as claimed in claim 1, wherein replacing the first material with the one or more second materials comprises growing the one or more second materials within the template structure of the third material from the seed structure.

10. The method as claimed in claim 1, wherein the photonic crystal structure of the first material comprises a plurality of rods of the first material.

11. The method as claimed in claim 1, further comprising removing the seed structure of the first material after the growing of the one or more second materials within the template structure.

12. The method as claimed in claim 1, further comprising providing electrical contacts to the one or more second materials.

13. The method as claimed in claims in claim 1, wherein patterning the first material comprises performing an etching based on HBr chemistry.

14. The method as claimed in claim 1, wherein the growing of the one or more second materials is performed by one of: metal organic chemical vapor deposition (MOCVD); atmospheric pressure CVD; low or reduced pressure CVD; ultra-high vacuum CVD; molecular beam epitaxy (MBE); atomic layer deposition (ALD) and hydride vapor phase epitaxy.

15. The method as claimed in claim 1, wherein the one or more second materials are optically active materials.

16. The method as claimed in claim 1, wherein the one or more second materials are selected from the group consisting of: InP; InGaAs; AlGaAs; GaAs; GaN; InGaN; AlGaN; a ternary or a quaternary alloy thereof; group II-VI semiconductors and group IV semiconductors.

17. The method as claimed in claim 1, wherein the first material is silicon.

18. The method as claimed in claim 1, wherein the third material is a dielectric material.

19. The method as claimed in claim 18, wherein the third material is an oxide.

* * * * *